United States Patent [19]

Addamiano

[11] Patent Number: 4,556,436
[45] Date of Patent: Dec. 3, 1985

[54] METHOD OF PREPARING SINGLE CRYSTALLINE CUBIC SILICON CARBIDE LAYERS

[75] Inventor: Arrigo Addamiano, Alexandria, Va.

[73] Assignee: The United States of America as represented by the Secretary of the Navy, Washington, D.C.

[21] Appl. No.: 643,327

[22] Filed: Aug. 22, 1984

[51] Int. Cl.$^4$ .................. H01L 21/205; H01L 29/04
[52] U.S. Cl. .................................. 148/175; 29/576 E; 148/DIG. 148; 156/610; 156/611; 156/613; 156/DIG. 64; 423/345
[58] Field of Search .............. 148/175, DIG. 148; 29/576 E; 156/610, 611, 613, DIG. 64; 423/345

[56] References Cited

U.S. PATENT DOCUMENTS

| | | | |
|---|---|---|---|
| 2,854,364 | 9/1958 | Lely | 148/1.5 |
| 3,129,125 | 4/1964 | Hamilton | 148/175 X |
| 3,147,159 | 9/1964 | Lowe | 148/174 |
| 3,228,756 | 1/1966 | Hergenrother | 148/175 X |
| 3,236,780 | 2/1966 | Ozarow | 148/175 X |
| 3,275,415 | 9/1966 | Chang et al. | 148/174 X |
| 3,458,779 | 7/1969 | Blank et al. | 148/186 X |

OTHER PUBLICATIONS

Kroko, L. J., "Growth Studies of Silicon Carbide Crystals", J. Electrochem. Soc., vol. 113, No. 8, Aug. 1966, pp. 801-808.
Knippenberg, W. F., "Growth Phenomena in Silicon Carbide", Philips Research Reports, vol. 18, No. 3, Jun. 1963, pp. 1, 176-179, 244-273.

Primary Examiner—William G. Saba
Attorney, Agent, or Firm—Robert F. Beers; William T. Ellis; Ansel M. Schwartz

[57] ABSTRACT

A method of making very pure cubic silicon carbide, SiC, comprising the steps of: loading a first inner graphite cup of a Lely type furnace while cold with a large number of crystals of SiC that are used as substrates; sealing the first cup with a graphite lid; inserting the first cup into a second graphite cup and inserting them into the furnace; filling the area between the first cup and the second cup with SiC; heating the first cup to between 2300° C. and 2700° C. until an atmosphere saturated with Si, C, SiC$_2$ and Si$_2$C is created; and cooling the furnace quickly to a temperature less than 1800° C.

14 Claims, 3 Drawing Figures

METHOD OF PREPARING SINGLE CRYSTALLINE CUBIC SILICON CARBIDE LAYERS

BACKGROUND OF THE INVENTION

The present invention relates to the production and preparation of single crystalline cubic silicon carbide layers.

Interest in cubic silicon carbide as a semiconductor material is due to the high electric mobility and to the large field of existence of this crystal modification of silicon carbide. According to W. F. Knippenberg, THESIS; Philips Research Reports 18, 161–274(1963), cf. p. 271, the field of existence of cubic silicon carbide extends from 1,000° C. to 2750° C. Unfortunately the preparation of layers of cubic SiC by chemical vapor deposition (CVD) at relatively low temperatures is hampered by the lack of substrates with suitable lattice dimensions and thermal expansion coefficients. Large single crystals of cubic SiC are not available. The growth on silicon substrates is delicate because of large differences in lattice constants and thermal expansion coefficients. Growth on diamond is prevented by the graphitization of the diamond at about 1100° C.

It must be noted, however, that in the preparation of hexagonal SiC by the Lely technique (a high temperature evaporation technique most often used to get hexagonal crystals of silicon carbide) cubic silicon carbide layers are often formed on the surface of hexagonal SiC plates. J. A. Lely and F. A. Kröger (see Semiconductors and Phosphors, Interscience, N.Y. 1958, p. 516) studied the optical transmission of a hexagonal Lely crystal having a cubic overgrowth 30 microns thick (more than is required for the making of electron devices), and Knippenberg (1. cit. pp. 263–266) prepared hexagonal crystals with cubic overlays whose dimensions reached 7 mm diam., and 0.5 mm thickness, by bringing the Lely furnace to about 2700° C., allowing the growth of hexagonal crystals (a lengthy process) and then quickly cooling the furnace.

However, no routine technique exists to prepare very pure cubic silicon carbide layers and devices.

SUMMARY OF THE INVENTION

Accordingly, one object of this invention is to provide a novel method for producing very pure cubic silicon carbide crystals.

Another object of this invention is to provide a fast and inexpensive method for producing very pure cubic silicon carbide crystals.

Another object of this invention is to provide a fast and inexpensive method for producing very pure cubic silicon carbide crystals with high n-type conductivity.

Yet another object of this invention is to provide a fast inexpensive method for producing very pure cubic silicon carbide crystals with high p-type conductivity.

Another object of this invention is to provide a fast inexpensive method for producing very pure cubic silicon carbide homojunctions.

Briefly, the above objects are realized by a method of making very pure cubic silicon carbide comprising the steps of: loading a first inner graphite cup of a Lely-type furnace, while cold, with a large number of crystals of SiC that are used as substrates; sealing the first cup with a graphite lid; inserting the first cup into a second cup and inserting them into the furnace; filling the area between the first cup and the second cup with SiC; heating the furnace to between 2300° C. and 2700° C. until an atmosphere saturated with Si, C, $SiC_2$ and $Si_2C$ is created; and cooling the furnace quickly to a temperature less than 1800° C. Consequently, very pure cubic silicon carbide crystals are obtained.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
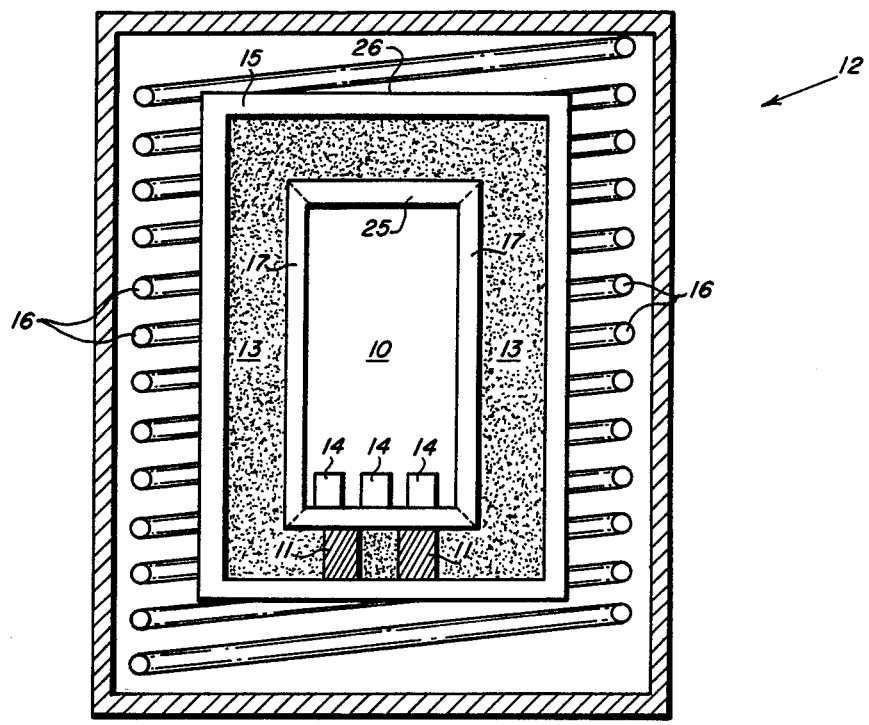
FIG. 1 is a schematic cross-sectional view of an inductively heated Lely-type furnace with SiC single crystal substrates placed on the bottom of a porous graphite cup.

Referring now to the drawings, wherein like reference numerals designate identical or corresponding parts wherein throughout the several views, and more particularly to FIG. 1 thereof where a Lely-type furnace 12 with first and second graphite cups, 10 and 26 respectively, are shown. A method for producing cubic silicon carbide layers for electronic devices comprises the following procedure. A first porous graphite cup 10 of a Lely-type furnace 12 is loaded, while cold, with well developed hexagonal SiC plates 14. The first cup 10 is then sealed with a graphite lid 25 and placed atop cylinder 11, which support the first cup above the floor of a second graphite cup 26. The cylinders 11 can be made of any material that is chemically inert with respect to the other materials and which can also support the weight of the first cup 10. The first cup 10 is usually made of graphite. Powdered silicon carbide 13 is poured around the sealed cup of porous graphite until the entire area between the wall 15 of the second cup 12 and the first sealed cup 10 is filled. The wall 17 and the graphite lid 25 of the first sealed cup 10 are comprised of graphite with a density of about 1.5 g/cm$^3$ and the wall 15 of the second cup is comprised of graphite with a density greater than or equal to 1.6 g/cm$^3$.

The second cup 26 containing the first cup 10 and the powdered silicon carbide 13 is then placed into the Lely-type furnace 12. It should be noted that a furnace that is longer in the width than the length is desired. Optimally, such a design reduces temperature gradients and allows more even growth of the cubic SiC crystals. The center of the furnace 12 is then brought to a high temperature of between 2300°–2700° C., for a short time (about 30 min) to get an atmosphere saturated with vapors of Si, C, $SiC_2$ and $Si_2C$ (and dopants, if so desired). The vapors seep through the pores in the graphite wall 17 of the first sealed cup due to the temperature being slightly cooler inside the first sealed cup 10 than outside it. Quick cooling of the hot zone of the furnace 12 then takes place allowing condensation of the vapors on the hexagonal SiC plates 14, with formation of cubic SiC layers. Thus the lengthy operation of growth of hexagonal crystals is avoided, and a more favorable geometrical distribution of the substrates can be used. Since the plates on which growth of cubic SiC occurs need not be extremely pure to act as substrates for vapor condensation, they can be obtained from commercial manufacturers of silicon carbide.

In the practice of this invention induction heating with induction coils 16, rather than resistance heating, is preferred, since it affords a faster way to attain the high temperature of operation and substantially reduces the need for a large thermally insulating mass, so that fast heating and cooling rates may be attained. Resistance heating, however, can be used if a high frequency power supply is not available.

The hexagonal plates 14 used as substrates can be 6H SiC crystals, a high temperature form of SiC. Other crystal forms of SiC, however, can be used as well e.g. 8H SiC; 15R SiC; 21R SiC, etc. Crystals of these modifications can be put on the bottom of the first cup 10 of the Lely type furnace see FIG. 1, or perpendicular to the wall 17 of the first cup 10, see FIG. 2, and/or on graphite supports 17 introduced into the cavity, e.g. graphite rods, spirals or helicoidal supports, see FIG. 3, and other suitable geometries.

The atmosphere of the furnace 12 is usually argon at 1 atm pressure. A trace of nitrogen, 0.1 to 1.0% by volume, helps increase the yield of cubic crystals with high n-type conductivity. (See A. Addamiano and L. S. Staikoft, J. Phys. Chem. Solids 26,669 (1965))

P-type conductivity requires the presence of a group III element (B, Al, Ga, In) in the atmosphere of the furnace. The metals as well as the chlorides and hydrides of those elements are suitable p-type dopants, since they are volatile and are incorporated easily at the temperatures of operation. Concentrations in the 0.1 to 1.0% range of the chlorides and hydrides (by volume) in the flowing gas permit a wide range of dopant concentration in the cubic SiC layers.

Cubic SiC layers on hexagonal SiC, as obtained, form heterojunctions, which may find immediate use in electronic devices. If, however, cubic layers free from hexagonal SiC are wanted, the hexagonal layers can be removed by lapping with diamond powder or other techniques. It must be stressed that the deposition of cubic layers on hexagonal SiC substrates by the process above described, i.e., heating to a high temperature the first graphite box containing hexagonal plates of SiC, equilibrating the temperature at between 2300° C. and 2700° C., and then quickly cooling, can be reiterated with deposition of a second, third, . . . , nth layer of cubic SiC. Also successive layers need not have the same conductivity type, e.g. the first grown layer can be prepared in an n-type producing environment, and the second layer in a p-type producing environment. Thus cubic SiC homojunctions can be obtained. Lower operating temperatures and low cooling rates lead to relatively thin layers of cubic SiC. High temperatures and high cooling rates favor thicker cubic SiC. Thus by changing equilibrating temperature and cooling rates, a variety of cubic SiC structures can be prepared.

One embodiment that is possible from the many different possible embodiments that utilize the above-mentioned process to produce cubic SiC crystals is henceforth described. It should be understood that the description of this embodiment is for purposes of example and the process is not to be construed in any way as being limited to this specific embodiment.

Figure 2:
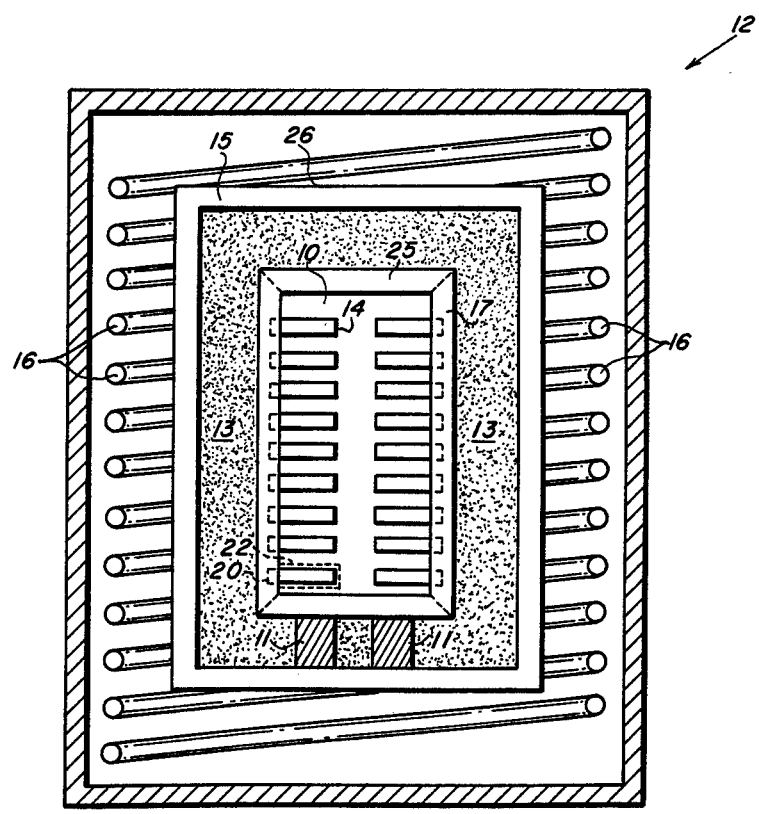
FIG. 2 is a schematic cross-sectional view of a Lely-type furnace with SiC crystals placed perpendicular to the walls of a porous graphite cup.
Figure 3:
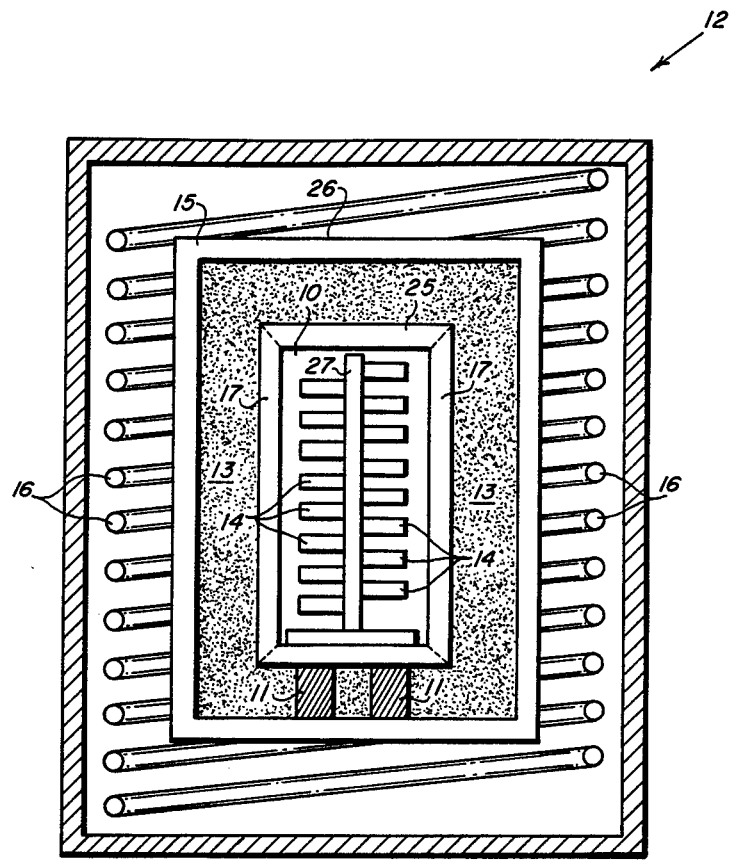
FIG. 3 is a schematic cross-sectional view of a Lely-type furnace with SiC crystals placed on a graphite support introduced into a graphite cup.

Referring to FIG. 2, in the porous graphite cup 10 (of about 400 ml volume) and having a tight-fitting graphite lid 25, a few dozen commercial crystals 14 of 6H SiC are inserted into small slots 20 located on the internal wall 17 of the first cup. The 6H SiC single crystals 14 contain a trace of aluminum as a main impurity, and are selected on the basis of body color, size, and flatness. If necessary they should be ground and polished with diamond paste, to achieve smooth, even surfaces.

All around the graphite cup 10 a charge 13 of the same 6H SiC, reduced to a fine powder, is held in place in a larger high density graphite cup 26 that serves as a susceptor of the induction Lely-type furnace 12. The furnace 12 is filled with slowly flowing argon (1 l/min) after exhausting. Then the temperature is brought to about 2600° C. and kept at that level for 15 minutes. Finally the furnace is switched off. As a result of the fast cooling, which produces a large oversaturation of the vapor in contact with the 6H SiC single crystals, a single layer of cubic SiC crystal 22 forms on the 6H SiC substrates 14. Typically such layers have a rounded outer surface, are 0.4 mm thick and have p-type conductivity.

While the basic improvement of the above described technique to prepare cubic SiC single crystal layers, as compared to Knippenberg's method, consists in introducing crystals of the high temperature forms of SiC in the Lely-type furnace while the furnace is cold, the advantages of this technique are quite large. Thus, the size and geometrical distribution of the substrates can be controlled. There is no need to allow formation of 6H SiC crystals, a process that requires many hours or even days, and which results in a large number of twin crystals, ill suited for deposition of cubic SiC. Faster, more controllable yields and production rates are obtained, and the mass of material to be brought to 2300°–2700° C. can be substantially reduced.

Obviously, numerous (additional) modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A method of making very pure cubic silicon carbide comprising the steps of:
    loading a first inner graphite cup of a Lely-type furnace, while cold, with a large number of crystal forms of SiC that are used as substrates;
    sealing the first cup with a graphite lid;
    inserting the first cup into a second graphite cup and inserting them into the furnace;
    filling the area between the first cup and the second cup with SiC;
    Heating the first cup by induction heating to between 2300° C. and 2700° C. until an atmosphere saturated with Si, C, $SiC_2$ and $Si_2C$ is created, said heating step taking no longer than 30 minutes; and
    cooling the furnace as quickly as possible to a temperature less than 1800° by turning off the induction heating.

2. The method of making very pure cubic silicon carbide as recited in claim 1 wherein:
    during the step of heating of the first cup the pressure in the furnace is maintained at between 0.5 and 1.5 atmospheres pressure of argon.

3. The method of making very pure cubic silicon carbide as recited in claim 2 wherein during said heating step a trace of nitrogen, 0.1 to 1.0% by volume, is added as an n-type dopant into the atmosphere of the furnace.

4. The method of making very pure cubic silicon carbide as recited in claim 2, wherein:
during said heating step a group III element, 0.1 to 1.0% by volume, is added in the atmosphere of the furnace as a p-type dopant.

5. The method of making very pure cubic silicon carbide as recited in claim 4 wherein:
during said heating step the group III element being added into the atmosphere of the furnace consists of a metal, a chloride or hydride of B, Al, Ga or In.

6. The method of making very pure cubic silicon carbide as recited in claim 1 with the additional step of removing the SiC substrate that the cubic SiC is grown on by the process of lapping.

7. The method of making very pure cubic silicon carbide as recited in claim 1 wherein:
during said loading step the crystal forms of SiC that are loaded as said substrates into the first cup consist of 6H, 8H, 15R or 21R SiC crystals.

8. The method of making very pure cubic silicon carbide as recited in claim 1 which further provides:
the additional step of reiterating at least one time said heating and cooling steps so at least one additional layer of cubic SiC is deposited.

9. The method of making very pure cubic silicon carbide as recited in claim 3 which further provides:
the additional step of reiterating at least one time the heating and cooling steps but with a p-type producing environment present during the reiteration step instead of the n-type producing environment that is present during the initial cubic SiC deposition steps, thus forming SiC homojunctions.

10. The method of making very pure cubic silicon carbide as recited in claim 4 which further provides:
the additional step of reiterating at least one time the heating and cooling steps but with an n-type producing environment present during the reiteration step instead of the p-type producing environment that is present during the initial cubic SiC deposition steps, thus forming SiC homojunctions.

11. The method of making very pure cubic silicon carbide as recited in claim 10 wherein:
during said reiteration step the n-type producing environment that is added into the atmosphere of the furnace consists of a trace of nitrogen 0.1 to 1.0% by volume.

12. The method of making very pure cubic silicon carbide as recited in claim 9 wherein:
during said reiteration step the p-type producing environment that is added into the atmosphere of the furnace consists of a group III element, 0.1 to 1.0% by volume.

13. The method of making very pure cubic silicon carbide as recited in claim 9 wherein:
during said reiteration step the p-type producing environment that is added into the atmosphere of the furnace consists of a group III element 1.1 to 1.0% by volume.

14. The method of making very pure cubic silicon carbide as recited in claim 13 wherein:
during said reiteration step the group III element that is added into the atmosphere of the furnace consists of a metal, a chloride or a hydride of B, Al, Ga or In.

* * * * *